United States Patent [19]
Kawaji et al.

[11] Patent Number: 6,072,215
[45] Date of Patent: Jun. 6, 2000

[54] SEMICONDUCTOR DEVICE INCLUDING LATERAL MOS ELEMENT

[75] Inventors: Sachiko Kawaji; Masahito Kodama; Takashi Suzuki; Tsutomu Uesugi, all of Aichi, Japan

[73] Assignee: Kabushiki Kaisha Toyota Chuo Kenkyusho, Aichi-gun, Japan

[21] Appl. No.: 09/275,868

[22] Filed: Mar. 25, 1999

[30] Foreign Application Priority Data

Mar. 25, 1998 [JP] Japan .................................. 10-096615

[51] Int. Cl.[7] .......................... H01L 29/76; H01L 31/113
[52] U.S. Cl. ........................................... 257/334; 257/343
[58] Field of Search .................................. 257/330, 334, 257/343, 331, 332, 333

[56] References Cited

U.S. PATENT DOCUMENTS

| | | | |
|---|---|---|---|
| 5,124,764 | 6/1992 | Mori | 357/23.4 |
| 5,627,393 | 5/1997 | Hsu | 257/331 |
| 5,708,286 | 1/1998 | Uesugi et al. | 257/330 |
| 5,723,891 | 3/1998 | Malhi | 257/341 |

FOREIGN PATENT DOCUMENTS

0 526 939 A1   2/1993   European Pat. Off. .

*Primary Examiner*—Donald L. Monin, Jr.
*Attorney, Agent, or Firm*—Oblon, Spivak, McClelland, Maier & Neustadt, P.C.

[57] ABSTRACT

Disclosed is a semiconductor device including a lateral MOS element which comprises a p-type silicon substrate; a first semiconductor layer of an n-type constituting a drift region; a second semiconductor layer of the p-type selectively provided in the first semiconductor layer, and constituting a body region, in which a channel region is partially formed; a third semiconductor layer of the n-type selectively provided in a surface of the second semiconductor layer, and constituting a source region; a fourth semiconductor layer of the n-type provided in the first semiconductor layer, and constituting a drain region; and a trench gate. The trench gate is constructed such that a trench formed in the first semiconductor layer is filled with a gate electrode with an insulating film interposed therebetween. The trench gate is formed such that at least a bottom thereof is in contact with the semiconductor substrate. The semiconductor device of the present invention prevents a high electric field at a corner of the bottom of the trench gate, thus achieving its high breakdown voltage.

16 Claims, 17 Drawing Sheets

SEMICONDUCTOR DEVICE INCLUDING LATERAL MOS ELEMENT

BACKGROUND OF THE INVENTION

1. Field of the Invention

The present invention relates to an insulated gate type semiconductor device, more particularly to a semiconductor device including a lateral power MOS field effect transistor which is used for supplying a high power output.

2. Description of the Related Art

While lateral MOS devices which allow a current to flow along a principal surface of a semiconductor substrate exhibits an advantage of a possibility to form a large number of elements on a single substrate, they require a wide device area. Accordingly, as a method to solve this problem, an employment of a gate electrode having a trench structure has been proposed.

FIG. 25 is a schematic cross-section showing an example of a semiconductor device to which the lateral MOS field effect transistor (hereinafter referred to as an MOS FET) structure having a trench gate electrode 60 is applied. The semiconductor device shown in FIG. 25 includes a silicon substrate 10; a drift region 14 containing n-type impurities, formed on the silicon substrate 10; a p-type body region 16 formed by diffusing p-type impurities in the principal surface of the drift region 14; and a source region 18 formed by selectively diffusing n-type impurities in the surface of the body region 16. At the surface of the drift region 14, an n-type drain region 20 is formed so as to be apart from the body region 16. A source electrode 44 is formed on top surface of the source region 18 and body region 16, and a drain electrode 46 is formed on the surface of the drain region 20.

The employment of such trench gate makes it possible to form a gate in a depth direction of the semiconductor substrate, so that an area per a unit cell can be smaller compared to semiconductor devices employing a planar gate structure.

However, the lateral MOS devices having the trench gate as shown in FIG. 25 entails the following problems. Specifically, in this lateral MOS device, a breakdown voltage of the device is generally determined by the pn junction formed between the body region 16 and the drain region 20 when 0V is applied to the gate. However, in the structure having the trench gate which is formed at the surface of the semiconductor substrate, upon application of a voltage between the source and the drain, the high electric field occurs at the bottom corner of the trench gate 60, and this high electric field may break the element. To prevent the breakdown phenomena due to such high electric field, a sufficiently deep body junction is required, which makes a high breakdown voltage. However, this leads to widening the body region 16 also in the lateral direction, so that an area occupied by the device increases. Therefore, a reduction of the device cell size may be disturbed and a difficulty to lower an on-resistance may be brought about.

SUMMARY OF THE INVENTION

The object of the present invention is to provide a semiconductor device including a lateral MOS element adopting a trench gate structure, which is capable of preventing an occurrence of a high electric field at a bottom corner of the trench gate and exhibits a high breakdown voltage.

Another object of the present invention is to provide a semiconductor device which is capable of reducing a channel distance as well as an area occupied by the semiconductor device of an insulated gate type while securing a drift region having a length sufficient to acquire a desired breakdown voltage, thereby achieving a further reduction in an area occupied by the device and an on-resistance of the device.

The semiconductor device of the present invention comprises:

a semiconductor substrate of a first conductive type;

a first semiconductor layer of a second conductive type formed on the semiconductor substrate, and constituting a drift region;

a second semiconductor layer of the first conductive type in which a channel region is formed, and being provided in the first semiconductor layer;

a third semiconductor layer of the second conductive type provided in the second semiconductor layer, and constituting a source region;

a fourth semiconductor layer of the second conductive type provided in the first semiconductor layer, and constituting a drain region; and a trench gate including an insulating film formed along a surface of a trench which penetrates at least through the first semiconductor layer, and a gate electrode formed within the trench so as to fill the trench interposing the insulating film, wherein at least a bottom of the trench gate contacts with the semiconductor substrate, and wherein the fourth semiconductor layer is formed facing the trench gate.

Since the trench gate is formed at a situation where at least a bottom thereof contacts with the semiconductor substrate, a high electric field at the bottom corner of the trench gate can be prevented when a voltage applies to between a source and a drain, whereby a high breakdown voltage of the device can be achieved.

In the above described semiconductor device, the fourth semiconductor layer of the first conductivity constituting the drain region should be formed at a state where it contacts with the semiconductor substrate of the second conductive type. With the structure of the semiconductor device of the present invention, an area of the fourth semiconductor layer faced to the trench gate is increased, then the on-resistance can be effectively decreased.

In the semiconductor device of the present invention, since carriers after passing through the channel flow through a carrier accumulation layer of a very low resistance, which is formed near the trench gate, and flow to the drain region (fourth semiconductor layer) facing the carrier accumulation layer while forming a substantially uniform path. Therefore, flow of the carriers through the carrier accumulation layer of the low resistance can suppress an increase in the on-resistance of the transistor.

Furthermore, since most of the drift region (first semiconductor layer) interposed between the trench gate and the drain region (fourth semiconductor layer) which face each other serves as the path allowing the carriers to pass therethrough, a cross sectional area of the current path significantly increases, resulting in an extreme reduction in a resistance of the drift region.

The semiconductor device of the present invention preferably further comprises a planar gate connected with the trench gate, and a buried gate facing the planar gate with the second semiconductor layer interposed therebetween. The semiconductor device of the present invention preferably comprises a buried region facing the trench gate with the second semiconductor layer interposed therebetween. The provision of such buried gates can reduce a channel resistance due to provision of the two insulated gates.

Furthermore, the semiconductor device of the present invention may comprise a substrate having an insulating layer at least on a surface thereof instead of the semiconductor substrate, wherein at least a bottom of the trench gate contacts with the insulating layer.

As described above, by adopting a structure that allows the bottom of the trench gate to contact with the insulating layer of an SOI structure, an electric field generated when a voltage applies to between the source and the drain is relaxed by the insulating layer, so that a high electric field at the corner of the trench gate can be suppressed.

DETAILED DESCRIPTION OF THE PREFERRED EMBODIMENTS

First Embodiment

Figure 1:
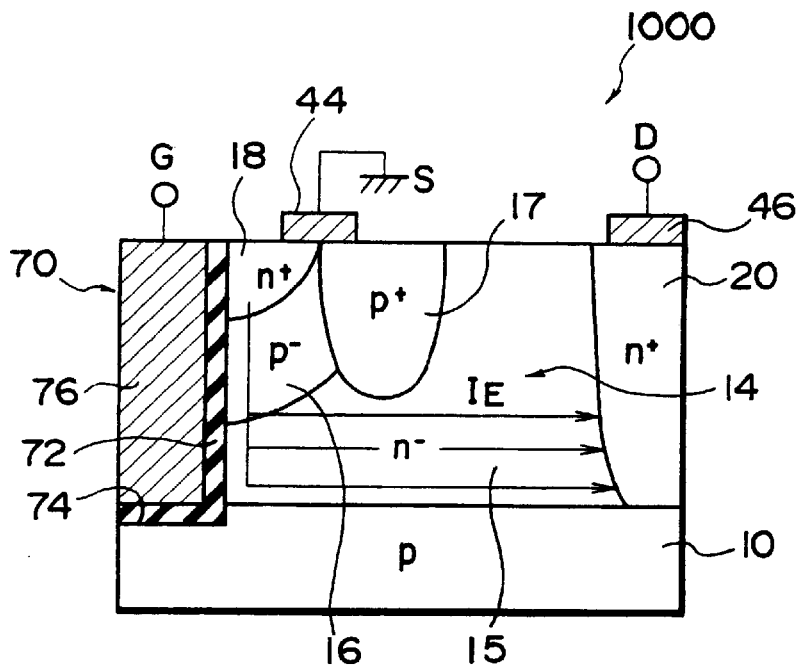
FIG. 1 is a schematic cross-section of a lateral power MOS FET in a first embodiment of the present invention.

FIG. 1 is a cross-section of an example of a semiconductor device in which the present invention is applied to a lateral power MOS FET adopting a trench gate structure.

The semiconductor device 1000 shown in FIG. 1 comprises a silicon substrate 10 containing p-type impurities; and a first semiconductor layer 14 disposed on the silicon substrate 10, which contains n-type impurities and constitutes a drift region 15. On the principal surface of the first semiconductor layer 14, disposed is a p-type body region (second semiconductor layer) 16 which is selectively formed by diffusing p-type impurities. Furthermore, on the principal surface of the body region 16, disposed is a source region (third semiconductor layer) 18 which is selectively formed by diffusing n-type impurities of a high concentration. These body region 16 and the source region 18 are formed by a double diffusion using a self-alignment technique. Moreover, a diffusion layer 17 containing p-type impurities of a high concentration is disposed outside the body region 16. By disposing the diffusion layer 17, the avalanche capability of the device can be increased.

On the first semiconductor layer 14, disposed are a trench gate 70 and a drain region (fourth semiconductor layer) 20 containing n-type impurities of a high concentration, which are apart from each other. The drain region 20 has a depth extending from the surface of the first semiconductor layer 14 to the surface of the silicon substrate 10. The trench gate 70 comprises a gate insulating film 72 formed on the surface of a trench 74 which penetrate through the source region 18, the body region 16 and the drift region 15 to reach the inside of the silicon substrate 10, and a gate electrode 76 formed of, for example, doped polysilicon, filled inside the gate insulating film 72. Furthermore, a source electrode 44 is formed on the surface of the source region 18, and a drain electrode 46 is formed on the surface of the drain region 20.

As described above, the trench gate 70 and the drain region 20 are formed so as to face to each other with the drift region 15 interposed therebetween, and a wide portion of the area between the trench gate 70 and the drain region 20 functions as a path for allowing carriers to flow uniformly, so that a cross sectional area of a current path $I_E$ can be large.

The semiconductor device of the present embodiment has a feature in that the trench 74 of the trench gate 70 is formed extending to the inside of the silicon substrate 10 so that the bottom corner of the gate insulating film 72 are disposed so as to be located inside the silicon substrate 10. This makes it possible to suppress a high electric field at the bottom corner portion of the trench gate 70 when the voltage is applied between the drain and the source, so that the breakdown voltage of the device can be further increased compared to those of devices which do not adopt the trench gate structure of the present embodiment. The reason why the high electric field at the bottom corner portion of the trench gate 70 can be suppressed is that the bottom corner portion of the trench gate is located inside the silicon substrate without directly facing the drift region and the bottom corner portion is kept at a substrate potential, for example, 0V.

In the semiconductor device 1000 of the present embodiment, the bottom of the trench gate 70 is positioned at least inside the silicon substrate 10, whereby the breakdown voltage of the device can be secured and the size of the drift region 15 which determines the breakdown voltage can be set to a minimum. Therefore, it is possible to realize a reduction of the device cell size and a lateral power MOS FET which has a low on-resistance and high breakdown voltage.

Second Embodiment

Figure 2:
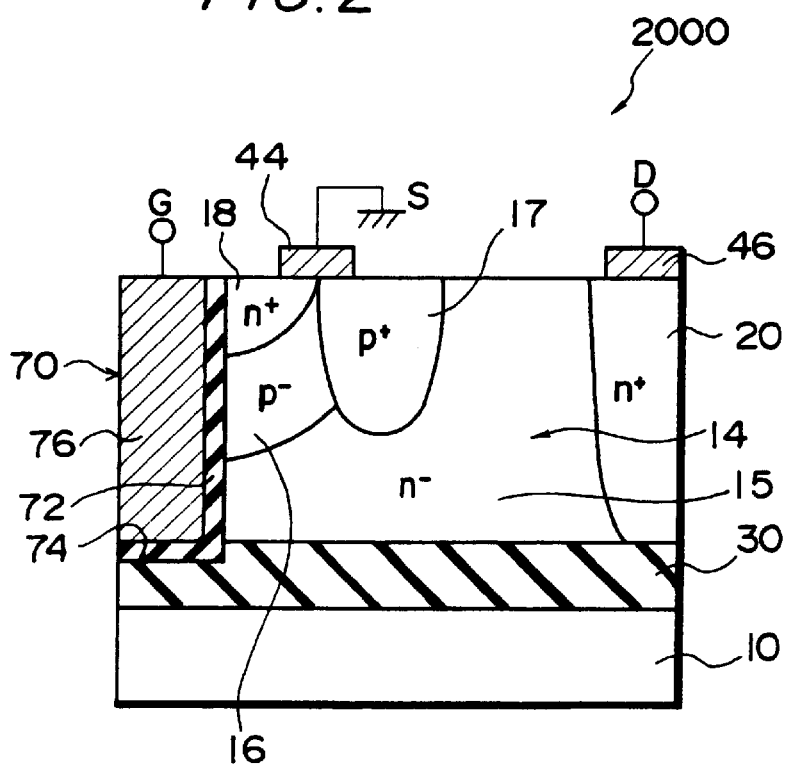
FIG. 2 is a schematic cross-section of a lateral power MOS FET in a second embodiment of the present invention.

FIG. 2 is a cross-section of an example of a semiconductor device in which the present invention is applied to a lateral power MOS FET adopting a trench gate structure. The semiconductor device 2000 according to the present embodiment is the same as the first embodiment except for the point that the semiconductor device 2000 comprises an SOI structure. In describing the present embodiment, constituent components exhibiting functions essentially identical to those used in the semiconductor 1000 of the first embodiment will be denoted using the same reference numerals, and description for the part of the constituent components is omitted.

A semiconductor device 2000 shown in FIG. 2 comprises a silicon substrate 10; an insulating layer 30 formed of silicon oxide, silicon nitride or the like; and a first semiconductor layer 14 containing n-type impurities, which is formed on the insulating layer 30 and constitutes a drift region 15.

A p-type body region (second semiconductor layer) 16 is selectively disposed on the principal surface of the first semiconductor layer 14, by diffusing p-type impurities. Moreover, on the principal surface of the body region 16, a source region (third semiconductor layer) 18 is selectively formed by diffusing n-type impurities of a high concentration. In the first semiconductor layer 14, a trench gate 70 and a drain region (fourth semiconductor layer) 20 are formed to be apart from each other. The drain region 20 has a depth extending from the surface of the first semiconductor layer 14 to the surface of the insulating layer 30.

The trench gate 70 includes a gate insulating film 72 formed on the surface of a trench 74 which extends from the surface of the first semiconductor layer 14 to inside the insulating layer 30; and a gate electrode 76 formed of, for example, doped polysilicon, which is formed inside the gate insulating film 72 so as to fill the trench 74. The bottom of the trench gate reaches the inside of the insulating layer 30, so that the gate insulating film 72 has virtually no corner. For this reason, the semiconductor device 2000 has an advantage that, when a voltage is applied between the source and the drain, an electric field is relaxed by the insulating layer 30 and no decrease of a breakdown voltage occurs at the bottom of the trench gate 70.

In the semiconductor device 2000 in the present embodiment, by contacting the bottom of the trench gate 70 with the insulating layer 30, a high breakdown voltage of the device can be secured and the size of the drift region 15 which determines the breakdown voltage can be a minimum. Therefore, it is possible to realize a reduction of the device cell size and a lateral power MOS FET which has a low on-resistance and high breakdown voltage.

Third Embodiment

Figure 3:
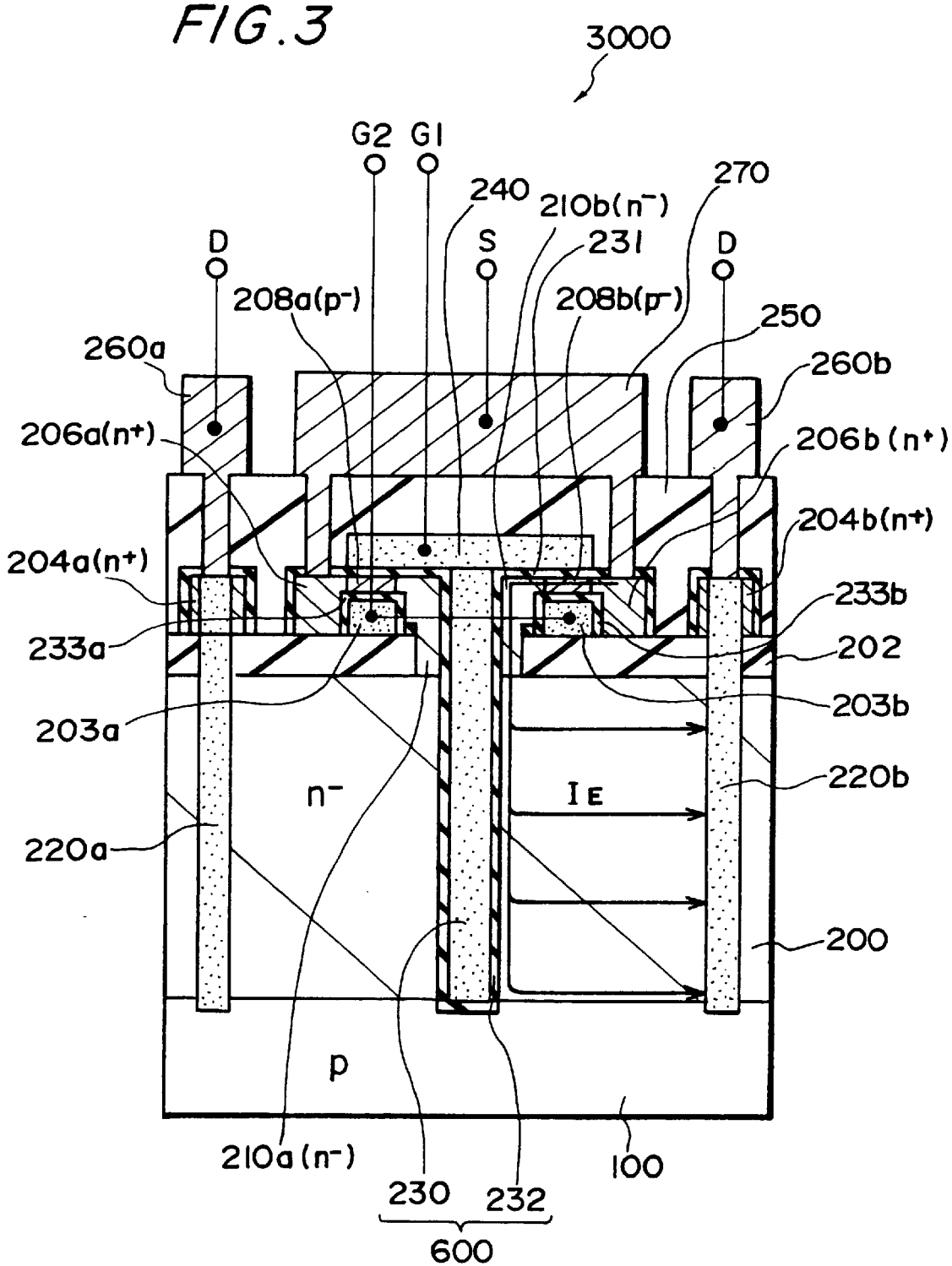
FIG. 3 is a schematic cross-section of a lateral power MOS FET in a third embodiment of the present invention.

Structure of the Device:

FIG. 3 shows a cross-section of a power MOS FET 3000 in a third embodiment of the present invention.

The device shown in FIG. 3 has a feature in that a first gate electrode (top gate electrode G1) comprises a horizontal portion (planar gate electrode) 240 and a vertical portion (trench gate electrode) 230, and drain electrodes 220*a* and 220*b* also comprise the trench structure so as to face the trench gate electrode 230 with a predetermined area, i.e., a planar facing. The cross-section of the device will be described below.

On the principal surface of a p-type silicon substrate 100, an n⁻-type semiconductor layer (first semiconductor layer) 200 formed by, for example, an epitaxial growth technique is formed, a part of which functions as a drift region of low impurity concentration. An insulating film 202 is formed on the surface of the n⁻-type semiconductor layer 200. Second gate electrodes 203*a* and 203*b* (bottom gate G2) having a conductive layer formed of polysilicon disposed on the insulating film 202.

Channel regions (second semiconductor layer) 208*a* and 208*b* are respectively formed over the second gate electrodes 203*a* and 203*b* with second gate oxide films 233*a* and 233*b* interposed therebetween. Buried gates comprise the second gate electrodes 203*a* and 203*b* and the second gate oxide films 233*a* and 233*b*, respectively. Over the channel regions 208*a* and 208*b*, a planar gate electrode 240 of the gate electrode (top gate G1) having a conductive layer formed of polysilicon is formed with the first gate oxide film 231 interposed therebetween, which connects with an oxide film 232 of the trench gate electrode 230. The top of the trench gate electrode 230 is connected to the central portion of the lower surface of the planar gate electrode 240, so that the top gate G1 has a T character-shaped cross-section. Moreover, the trench gate 600 comprising the trench gate electrode 230 and the gate insulating film 232 is formed in a manner that its bottom is inserted into the p-type silicon substrate 100.

n⁺-type source regions (third semiconductor layer) 206*a* and 206*b* are provided so as to contact with the channel regions 208*a* and 208*b*, respectively, and a source electrode (S) 270 is connected to each of the regions 206*a* and 206*b*.

n⁻-type regions 210*a* and 210*b*, each of which constitutes a part of the drift region, are provided between the n⁻-type semiconductor layer 200 and the channel regions 208*a* and 208*b*.

Furthermore, drain electrodes (D) 260*a* and 260*b* are formed so as to dispose the source electrode (S) 270 therebetween, and each of the drain electrode 260*a* and 260*b* is connected to corresponding one of the trench drains 220*a* and 220*b*. The trench drains 220*a* and 220*b* face the trench gate electrode 230 with a predetermined area, respectively. It should be noted that in FIG. 3 reference numeral 250 denotes an insulating layer for electrically isolating the source electrode 270 and the drain electrodes 260*a* and 260*b* from each other.

When the transistor turns on, electrons flow from the source to the drain along the path shown by the arrow $I_E$ in FIG. 3.

Figure 4:
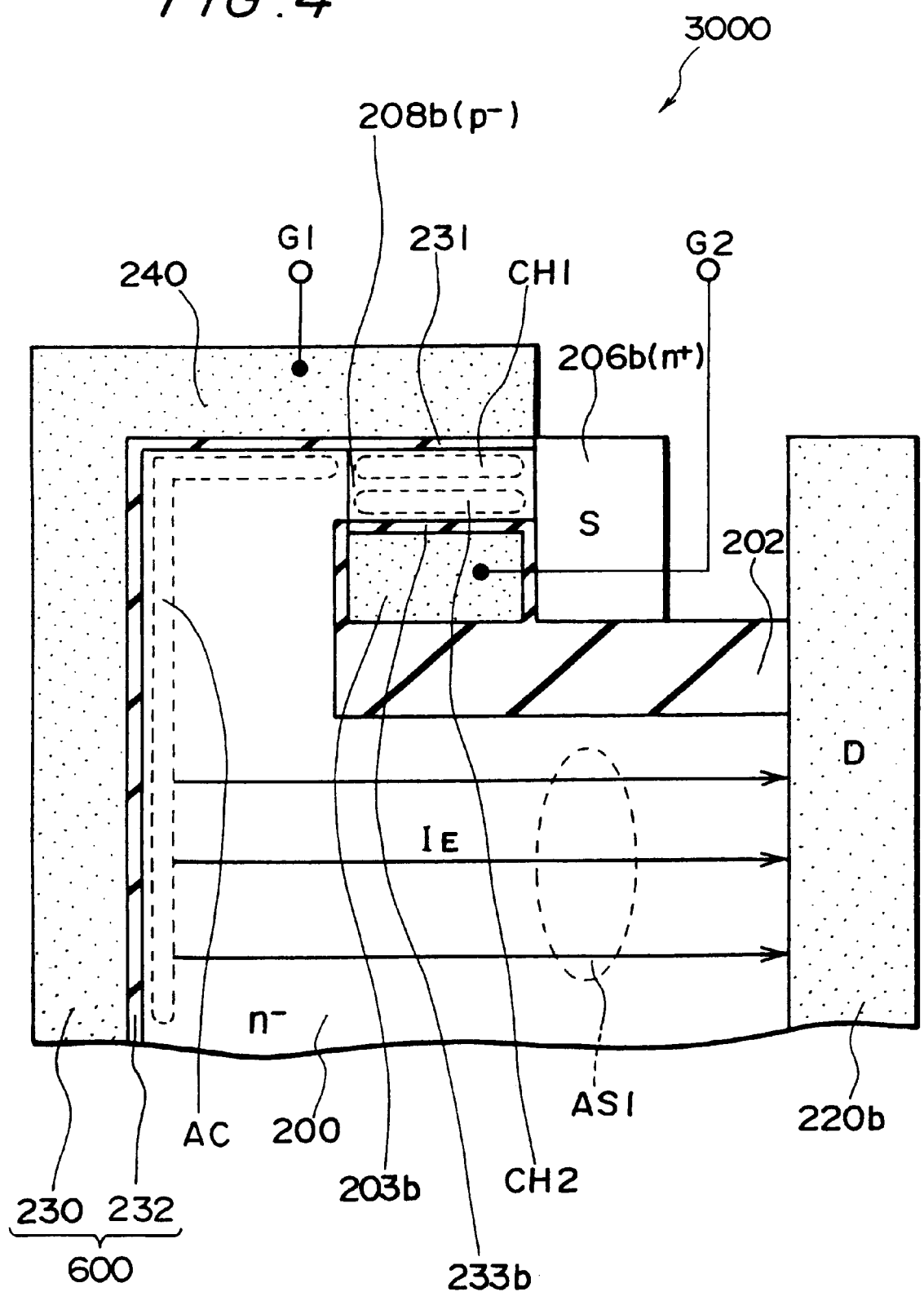
FIG. 4 is a schematic cross-section of an enlarged principal portion of the MOS FET of FIG. 3.

Feature of the Device:

The feature of the device of the present embodiment will be described with reference to FIG. 4 in more detail. FIG. 4 is a drawing shown by enlarging the part of FIG. 3.

With a simultaneous application of a voltage to the top gate G1 and bottom gate G2, channels CH1 and CH2 are formed in the p⁻-type channel region 208*b*, as shown in FIG.

4. Moreover, a carrier accumulation layer AC is formed in the periphery of the top gate G1. The carrier accumulation layer AC is formed so as to adjacent to the channel region (inversion channel) and to extend along the thickness direction of the substrate, as shown in FIG. 4.

Since the drain region (trench drain) 220b extending vertically is provided so as to face the trench gate 600 while locating the drift region (electric field relaxation region) 200 therebetween, the whole of the drift region 200 located between the trench gate 600 and the drain region 220b will act as a path which allows the carriers to uniformly flow therethrough. Specifically, as shown with the dotted line in FIG. 4, the area of the portions of both electrodes facing each other is a cross sectional area AS1 of the current path.

Accordingly, with the adoption of a double gate structure, the carriers (electrons in the case of the n-type transistor) after passing through the channel made to exhibit a low resistance flow through the carrier accumulation layer of a very low resistance to the opposite drain region while forming a uniform path. In this case, since the carriers flow through the carrier accumulation layer of a low resistance, the on-resistance of the device can be decreased.

Furthermore, the uniform carrier path (current path) is formed between the gate and the drain which faces to each other, and this implies that the cross sectional area of the current path significantly increases, so that it is possible to achieve an outstanding reduction in a resistance of the drift region. Specifically, a demand for a satisfactory electric field relaxation by the drift region and a demand for a low on-resistance by a reduction of the drift region are contrary to each other. Thus, if a size of the drift region necessary for the electric field relaxation was once determined, the bulk resistance of the drift region directly became the on-resistance, and this fact gave the limitation to the reduction of the on-resistance of the transistor.

However, the device of the present invention adopts the structure in which the trench gate and the drain region are disposed vertically (i.e. in the direction perpendicular to the principal surface of the substrate), and the cross sectional area of the current path is defined by the portions of the trench gate and the drift region facing to each other, leading to the increase in the cross sectional area of the current path. With such structure of the device of the present invention, the resistance of the drift region is reduced. Accordingly, without making a sacrifice of the electric field relaxation capability, the on-resistance can be further reduced.

In addition, in such the structure, since the gate and the drain are made to face to each other in the perpendicular direction to the principal surface of the substrate, a planar size of the chip, i.e., an area occupied by the device, by no means varies, and the chip size does not increase.

Moreover according to the semiconductor device of the present embodiment, the bottom of the trench gate 600 is positioned at least inside the silicon substrate 100, whereby the sufficient breakdown voltage of the device can be secured by the reason described above and the drift region which determines the breakdown voltage of the device can be set to a minimum. Therefore, the reduction of the device cell size, as well as a lateral power MOS FET which has a low on-resistance and high breakdown voltage, can be realized.

Figure 11:
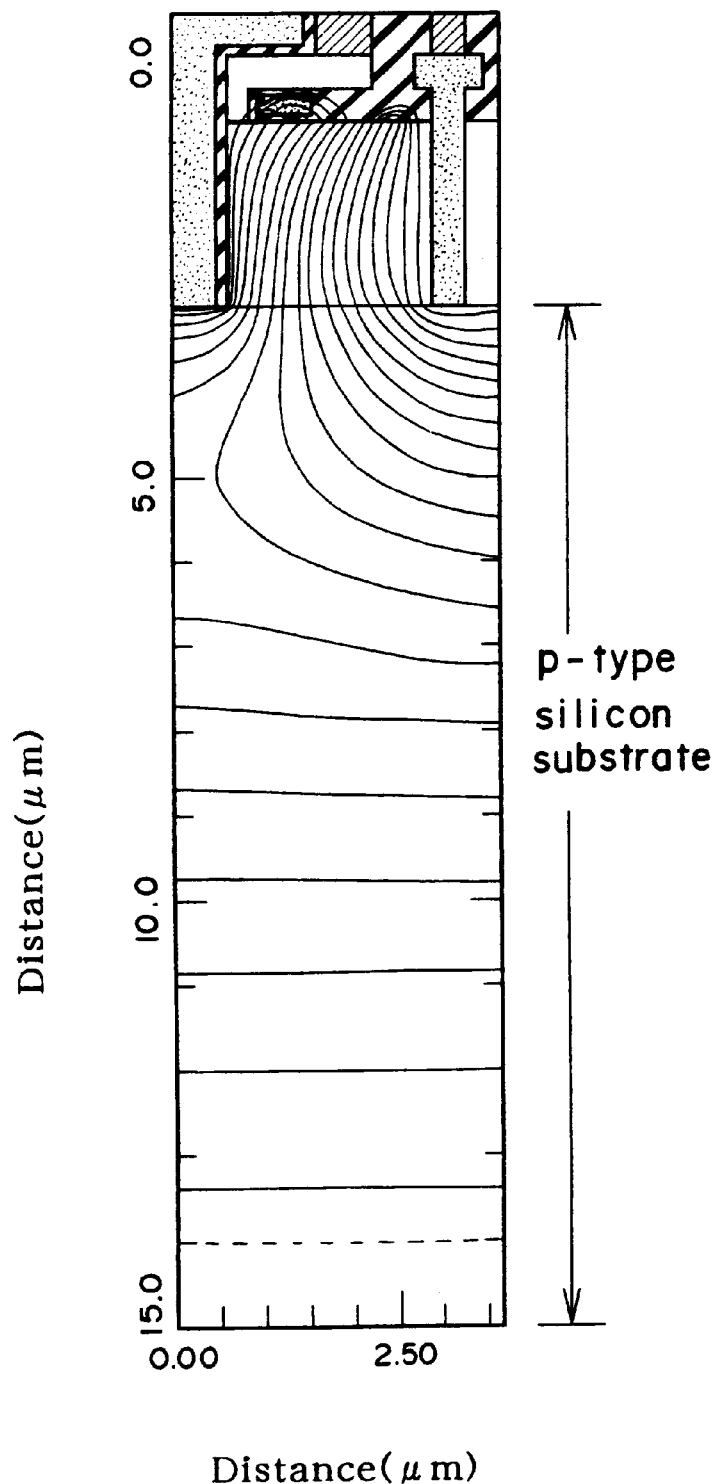
FIG. 11 is a simulation result using the lateral power MOS FET in the third embodiment of the present invention.

Simulation Results:

FIG. 11 shows the voltage distribution within the device in the third embodiment obtained from simulation. Noted that with reference to this simulation, the voltage distribution is shown when a voltage of 40V applies to between the source and the drain. For a comparison, the similar simulation results in the case where the bottom of the trench gate makes no contact with the substrate are shown in FIG. 12.

Figure 12:
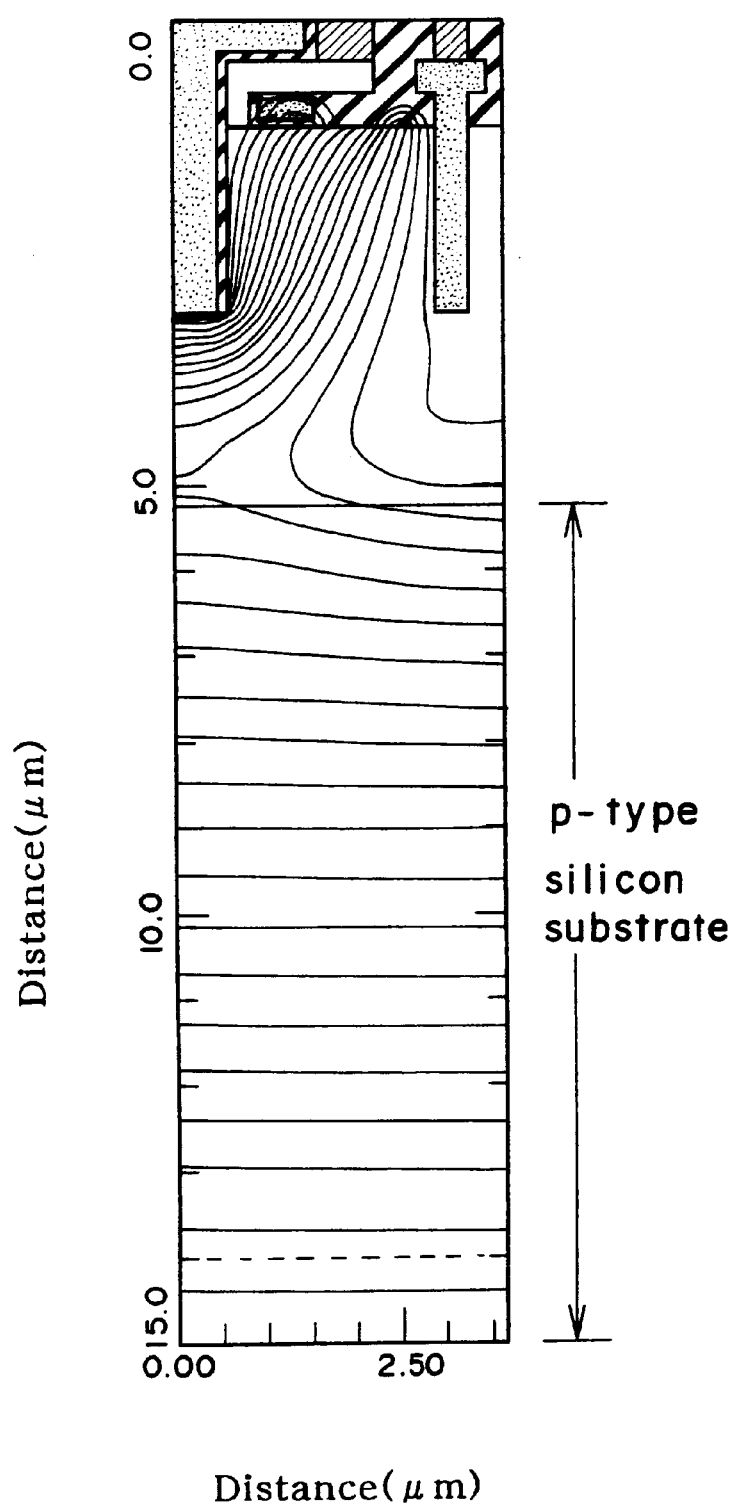
FIG. 12 is a simulation result using a lateral power MOS FET in a comparison example of the present invention.

FIGS. 11 and 12 make it clear that in the device of the present embodiment, the electric field is generated substantially uniformly in the drift region. Moreover, FIGS. 11 and 12 elucidate that in the device for comparison, the high electric field at the bottom corner of the trench gate.

Manufacturing Method of the Device:

A manufacturing method of the device shown in FIGS. 3 and 4 will be described with reference to FIGS. 5 to 10.

Figure 5:
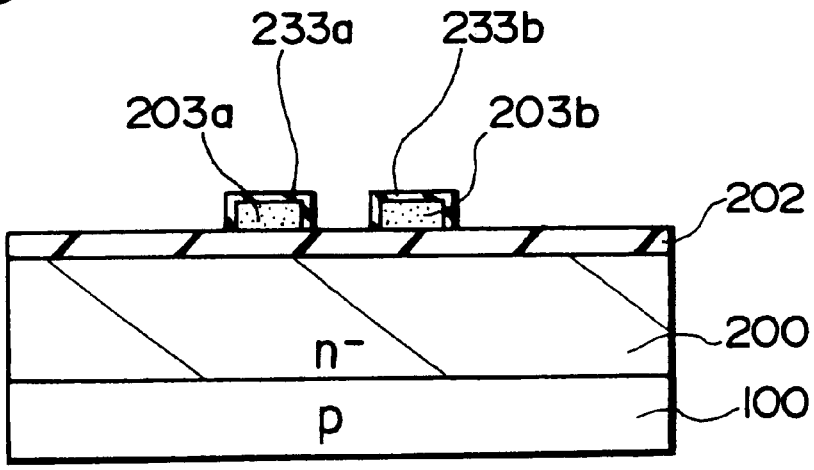
FIG. 5 is a schematic cross-section of a manufacturing method of the lateral power MOS FET in the third embodiment of the present invention.

Step 1:

As shown in FIG. 5, the n$^-$-type semiconductor layer 200 is formed on the p-type silicon substrate 100 by an epitaxial method. Subsequently, the oxide film (insulating film) 202 is formed on the surface of the n$^-$-type semiconductor layer 200, followed by the formation of a polysilicon film and patterning of the polysilicon film. Thus, the polysilicon layers 203a and 203b which serve as the bottom gate electrode are formed. Thereafter, the oxide films (gate insulating film) 233a and 233b are formed on the surfaces of the polysilicon layers 203a and 203b, respectively.

Figure 6:
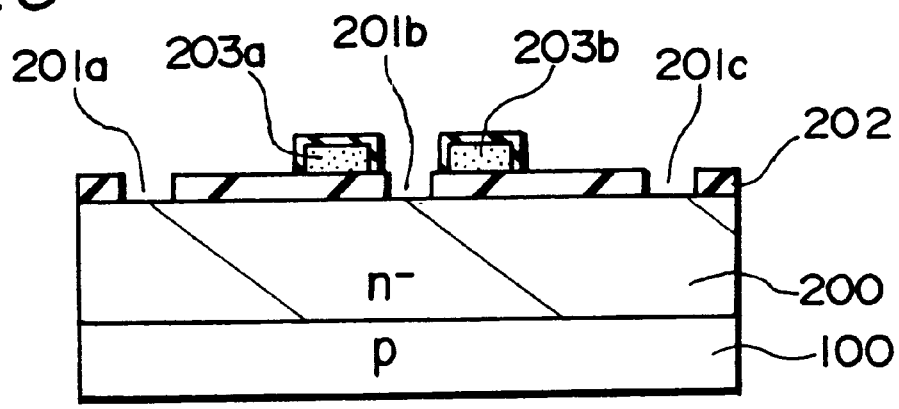
FIG. 6 is a schematic cross-section of a manufacturing method of the lateral power MOS FET in the third embodiment of the present invention.

Step 2:

As shown in FIG. 6, the insulating film 202 is selectively removed, so that windows 201a, 201b and 201c are formed. The portions of the surfaces of the semiconductor layer 200 exposed by these windows 201a, 201b and 201c serve as a seed area for a solid phase epitaxy (hereinafter referred to as an SPE) in the next step.

Figure 7:
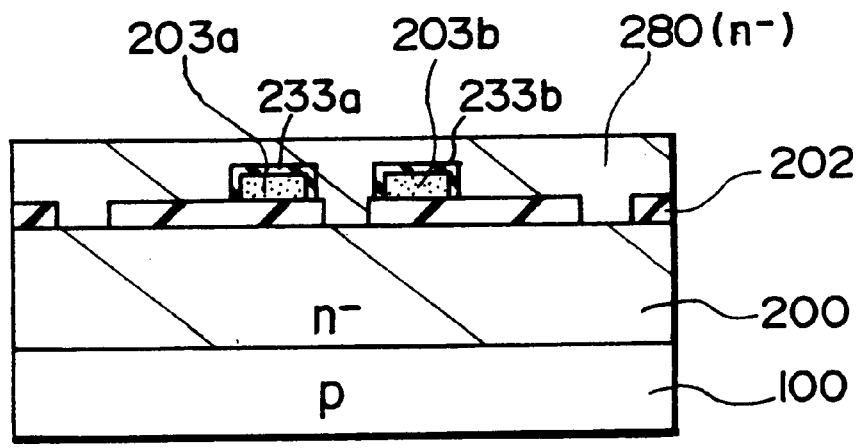
FIG. 7 is a schematic cross-section of a manufacturing method of the lateral power MOS FET in the third embodiment of the present invention.

Step 3:

As shown in FIG. 7, a single crystal layer 280 is formed on the insulating film 202 and the gate insulating films 233a and 233b using a SPE method.

Figure 8:
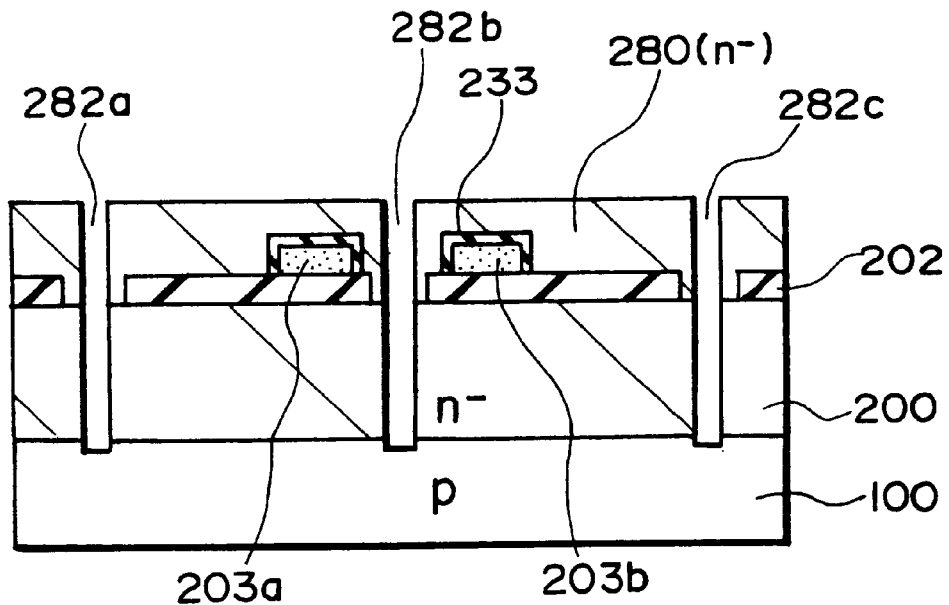
FIG. 8 is a schematic cross-section of a manufacturing method of the lateral power MOS FET in the third embodiment of the present invention.

Step 4:

As shown in FIG. 8, after a mask layer (not shown) is formed, portions where the mask layer does not cover are etched by such as a reactive ion etching (RIE), thus forming the trenches 282a, 282b and 282c. At this time, each trench is formed so that its bottom reaches the inside of the substrate 100.

Figure 9:
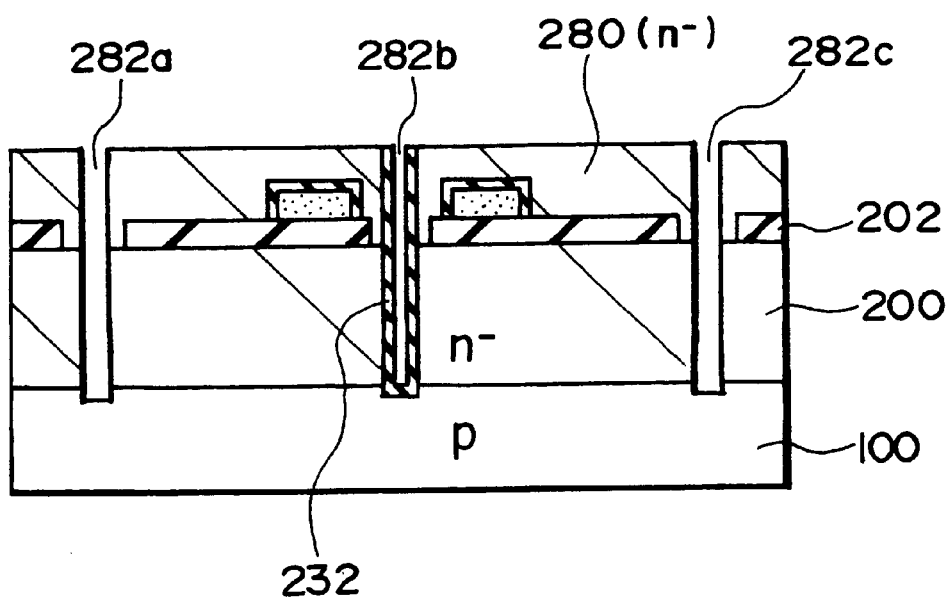
FIG. 9 is a schematic cross-section of a manufacturing method of the lateral power MOS FET in the third embodiment of the present invention.

Step 5:

As shown in FIG. 9, the insides of the trenches 282a, 282b and 282c are oxidized. Thereafter, the oxide films on the insides of the trenches 282a and 282c are removed.

Figure 10:
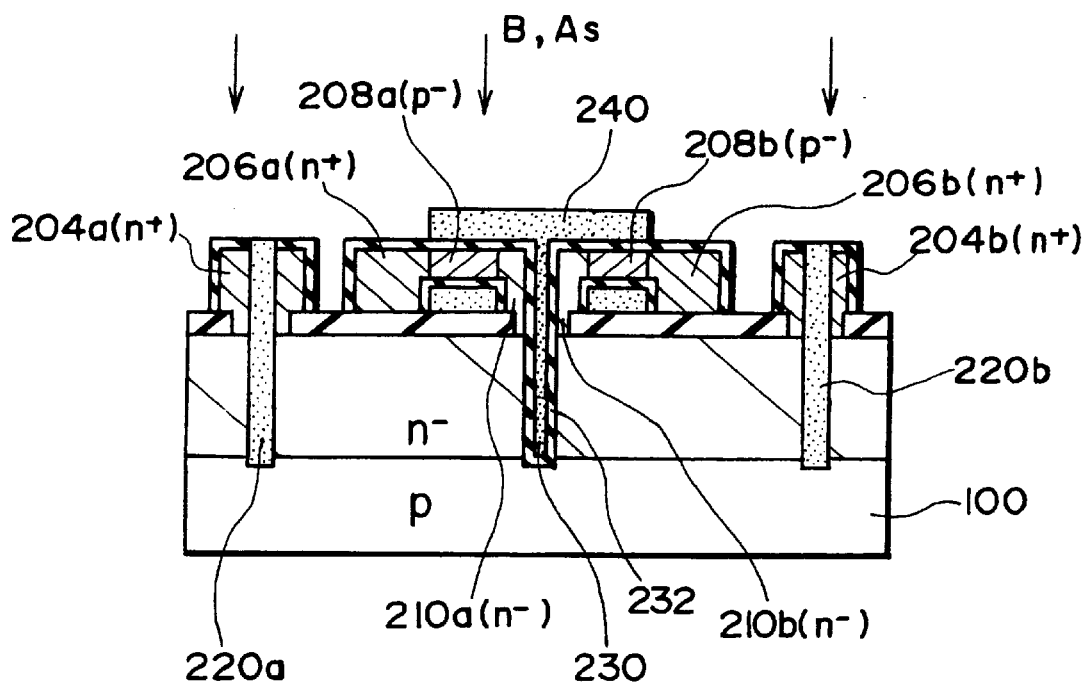
FIG. 10 is a schematic cross-section of a manufacturing method of the lateral power MOS FET in the third embodiment of the present invention.

Step 6:

As shown in FIG. 10, the trenches 282a, 282b and 282c are filled with the heavy doped polysilicons 220a, 230 and 220b respectively. Subsequently, the single crystal layer 280 is patterned, and the entire surface of the resultant structure is oxidized, followed by removing the oxide films on the doped polysilicons 220a and 220b.

Next, a polysilicon layer 240 which is the horizontal portion of the top gate electrode is formed, and boron (B) is doped using the polysilicon layer 240 as a mask and diffused. Subsequently, arsenic is doped and a thermal treatment is performed for recovering from damages. Thereafter, an insulating film is formed on the entire surface of the resultant structure, and then contact holes and electrodes are formed, thus completing the device of FIG. 3.

Fourth Embodiment

Figure 13:
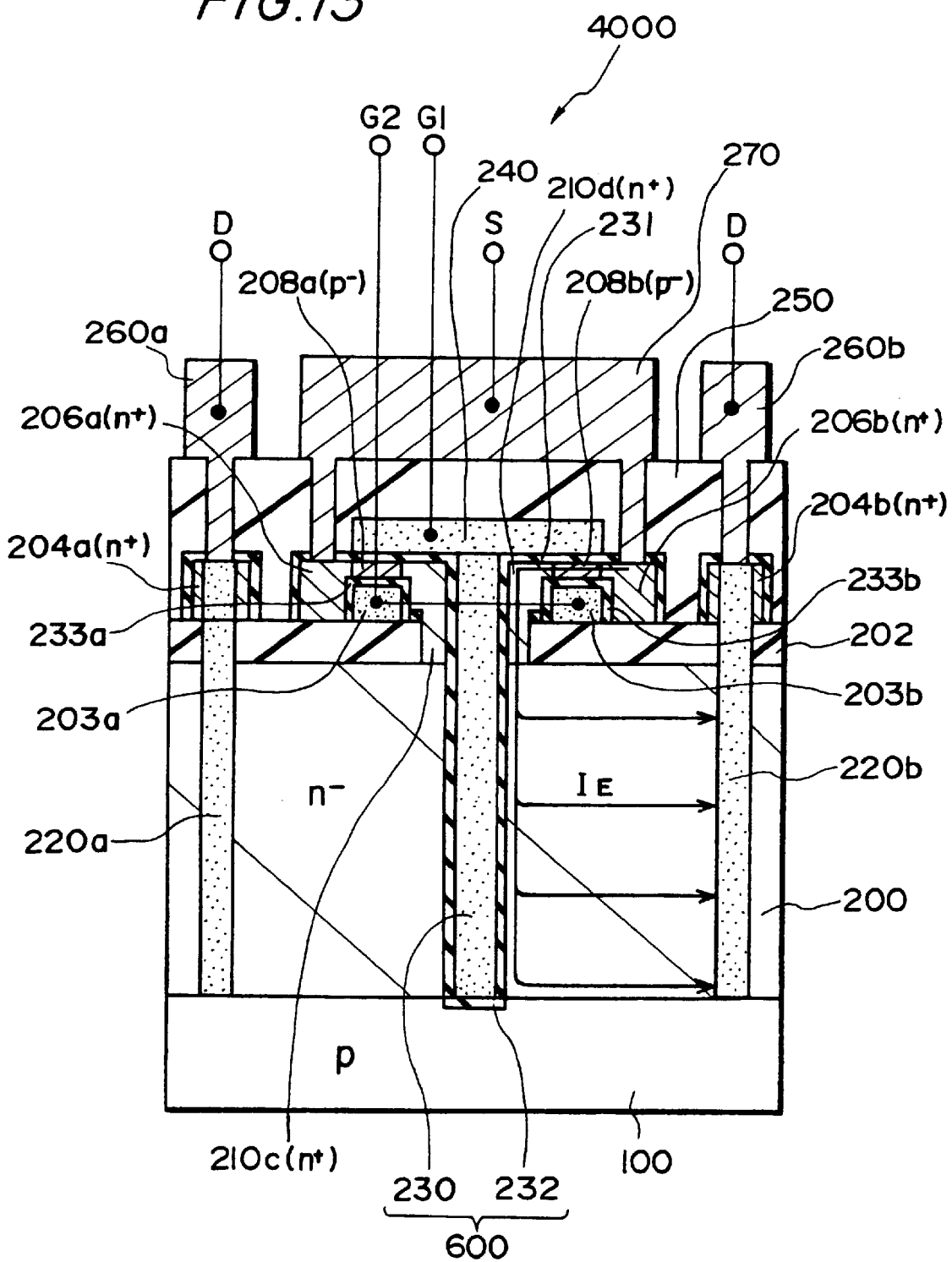
FIG. 13 is a schematic cross-section of a lateral power MOS FET in a fourth embodiment of the present invention.

In FIG. 13, a cross-section of a semiconductor device in a fourth embodiment of the present invention is shown. The semiconductor device 4000 of the present embodiment has a feature in that instead of the n$^-$-type regions 210a and 210b (see FIG. 3) containing n-type impurities of a low concentration, n$^+$-type regions 210c and 210d containing n-type impurities of a high concentration are formed between the channel regions 208a and 208b and the semiconductor layer 200 containing n-type impurities of a low concentration which constitutes the drift region. As other principal structure and operation of the device of the present embodiment are same as those of the third embodiment, constituent components exhibiting identical functions are denoted using the same reference numerals, and detailed descriptions for them are omitted.

In the present embodiment, the n$^+$-type regions 210c and 210d are formed between the channel regions 208a and 208b and the trench gate 600, respectively, whereby the resistance of these regions can be further reduced. Specifically, since potential at the regions (a part of the drift region), where the n$^+$-type regions 210c and 210d are formed, are fixed by a double gate comprising the first and second gate electrodes G1 and G2, even in a situation where a voltage is applied between the drain and the source, a resistance of this region can be minimized while securing the breakdown voltage of the device, leading to realizing a low on-resistance of the device.

Fifth Embodiment

Figure 14:
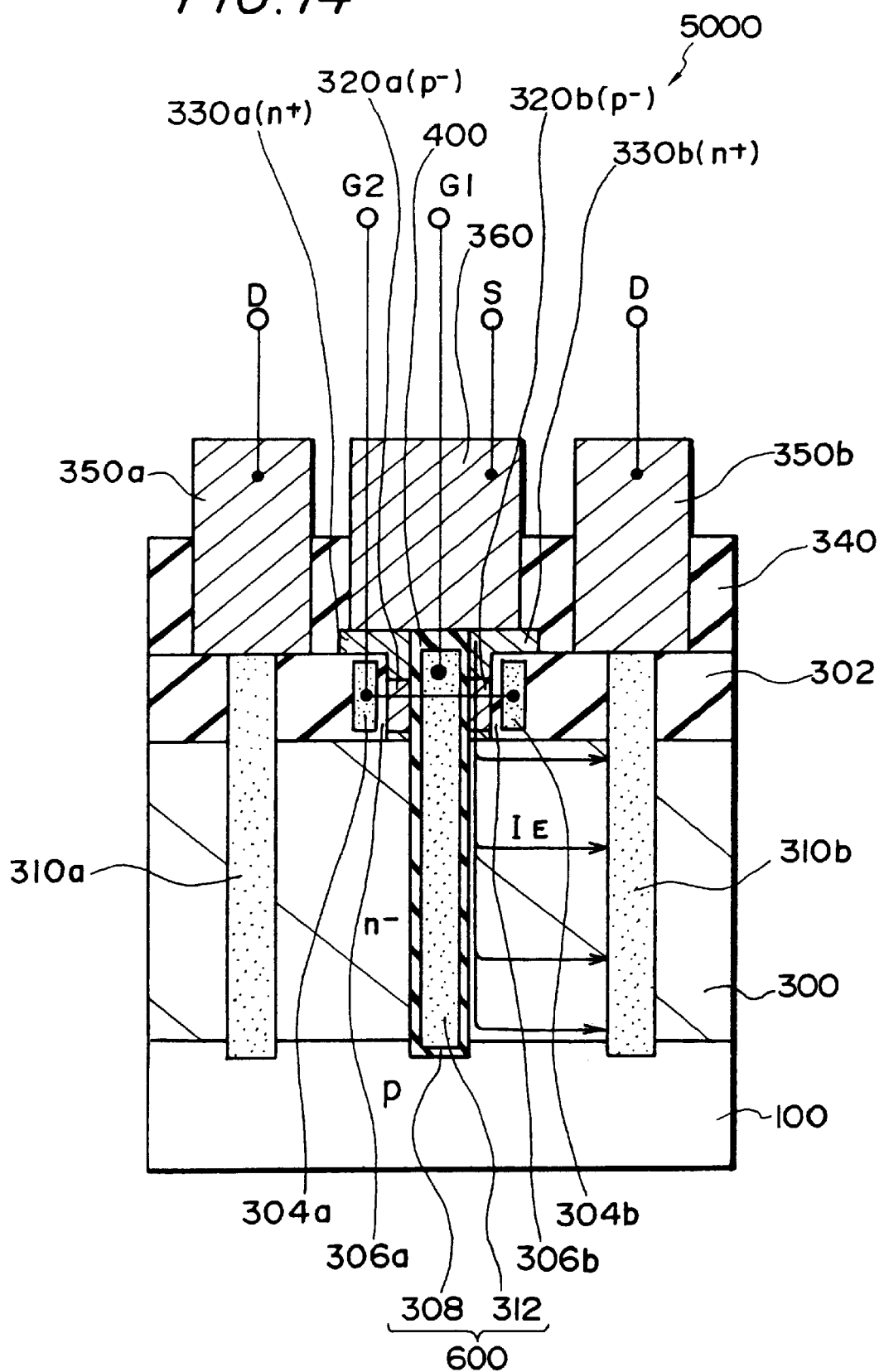
FIG. 14 is a schematic cross-section of a lateral power MOS FET in a fifth embodiment of the present invention.

Structure of the Device:

In FIG. 14, a cross-section of a semiconductor device 5000 in a fifth embodiment of the present invention is shown. The semiconductor device 5000 of the present embodiment has a feature in that a channel is formed in the vertical direction, i.e., in the direction of the trench. Specifically, the first and second gate electrodes G1 and G2 are formed in the perpendicular direction to the principal surface of the semiconductor substrate. As other principal structure and operation are similar to those of the semiconductor device 3000 shown in FIG. 3, detailed descriptions for them are omitted.

Referring to FIG. 14, reference numerals 320a and 320b denote channel regions, and reference numerals 330a and 330b denote source regions. Reference numeral 312 denotes a trench gate electrode, and reference numerals 310a and 310b denote trench drains. Furthermore, reference numerals 306a, 306b and 308 denote gate oxide films; a reference numeral 302, a surface insulating film; reference numeral 340, an interlayer insulating film; reference numerals 350a and 350b, a drain electrode; reference numeral 360, a source electrode; and reference numeral 400, an insulating film (cap oxide film) for separating the trench gate electrode 312 and the source electrode 360. Reference numeral 300 denotes an n$^-$-type semiconductor layer constituting a drift region. The trench gate 600 is constituted by the trench gate electrode 312 and the gate oxide film 308. A buried gate is constituted by the second gate electrodes 304a and 304b and the second gate oxide films 306a and 306b.

Manufacturing Method of the Device:

A manufacturing method of the semiconductor device 5000 shown in FIG. 14 will be described with reference to FIGS. 15 to 21.

Figure 15:
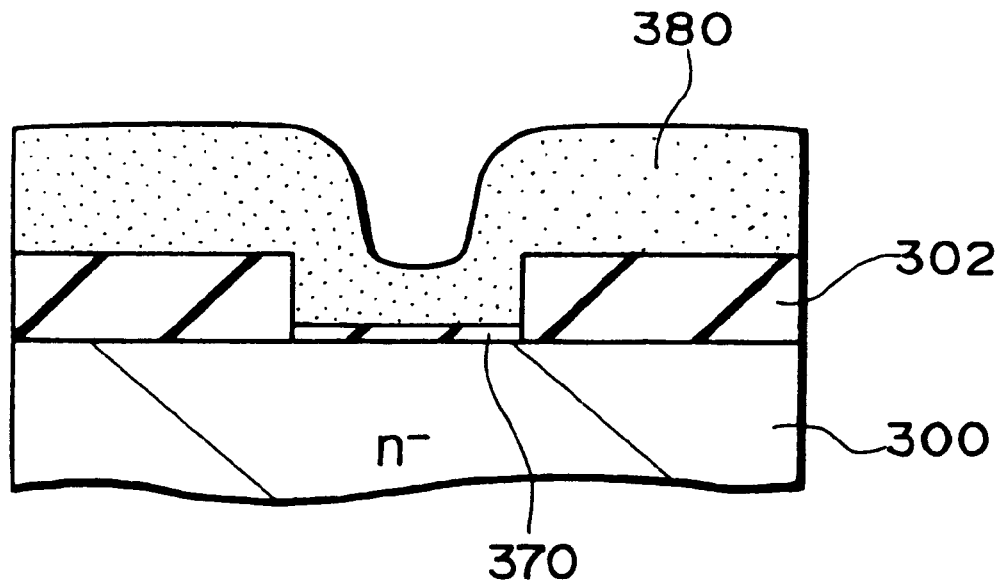
FIG. 15 is a schematic cross-section of a manufacturing method of the lateral power MOS FET in the fifth embodiment of the present invention.

Step 1:

As shown in FIG. 15, oxide films 302 and 370 are formed on the surface of the n$^-$-type epitaxial semiconductor layer 300 disposed on a p-type silicon substrate (not shown), followed by formation of the polysilicon layer 380.

Figure 16:
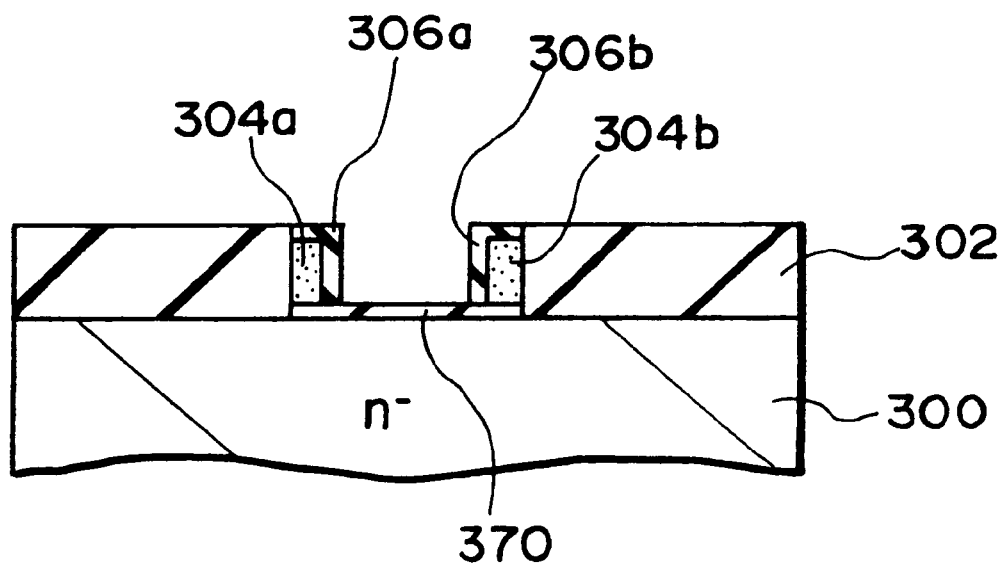
FIG. 16 is a schematic cross-section of a manufacturing method of the lateral power MOS FET in the fifth embodiment of the present invention.

Step 2:

Next, as shown in FIG. 16, the entire surface of the polysilicon layer 380 is etched by an RIE method to leave the polysilicon layers 304a and 304b only on the side wall portion of the oxide film 302. Subsequently, the surfaces of the polysilicon layers 304a and 304b are oxidized to form the oxide layers 306a and 306b. The polysilicon layers 304a and 304b on the side wall of the oxide film 302 serves as a first gate electrode G2.

Figure 17:
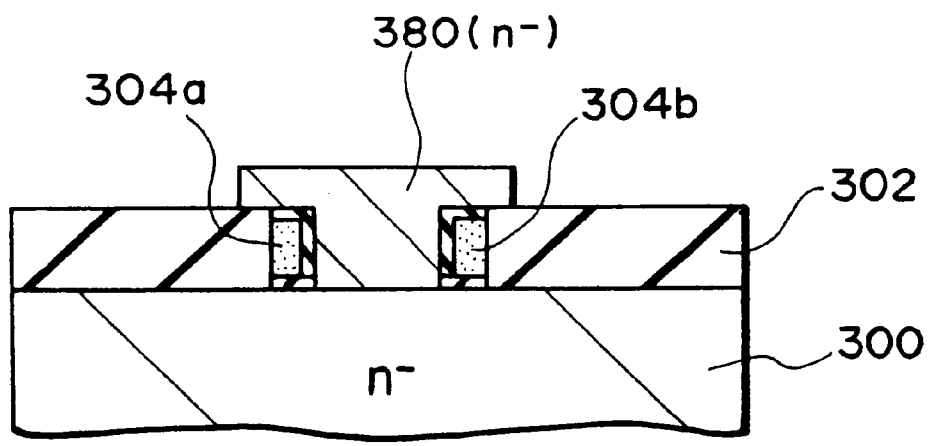
FIG. 17 is a schematic cross-section of a manufacturing method of the lateral power MOS FET in the fifth embodiment of the present invention.

Step 3:

Next, as shown in FIG. 17, a single crystal layer is formed using a SPE method, and patterned to form a single crystal island 380.

Figure 18:
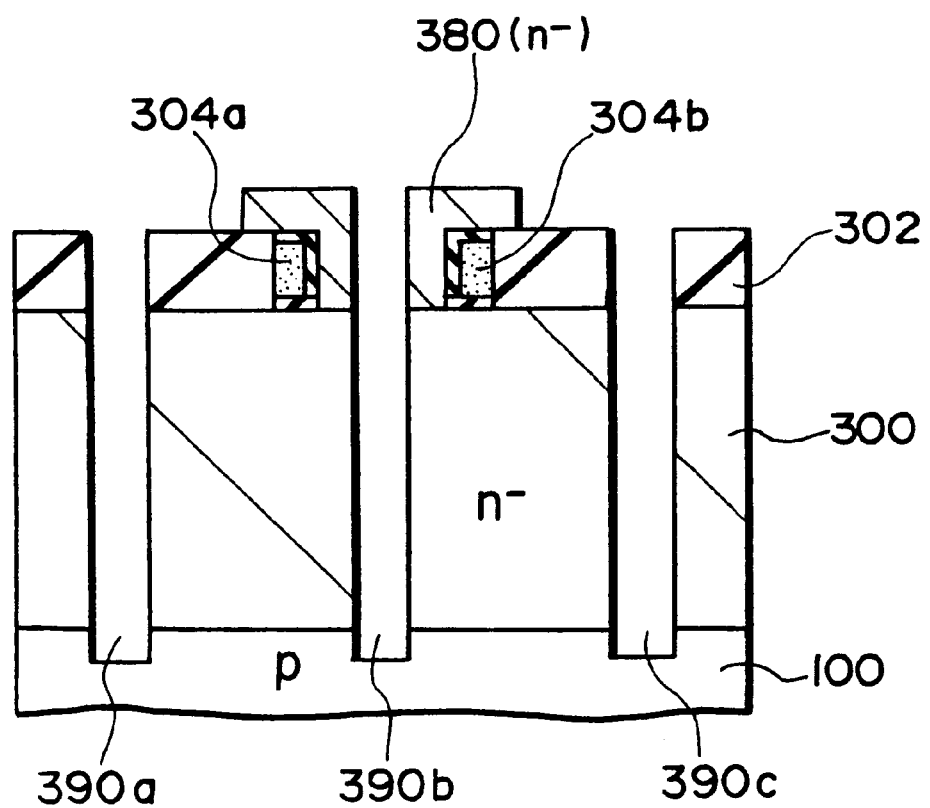
FIG. 18 is a schematic cross-section of a manufacturing method of the lateral power MOS FET in the fifth embodiment of the present invention.

Step 4:

Subsequently, as shown in FIG. 18, the trenches 390a, 390b and 390c reaching the silicon substrate 100 are formed.

Figure 19:
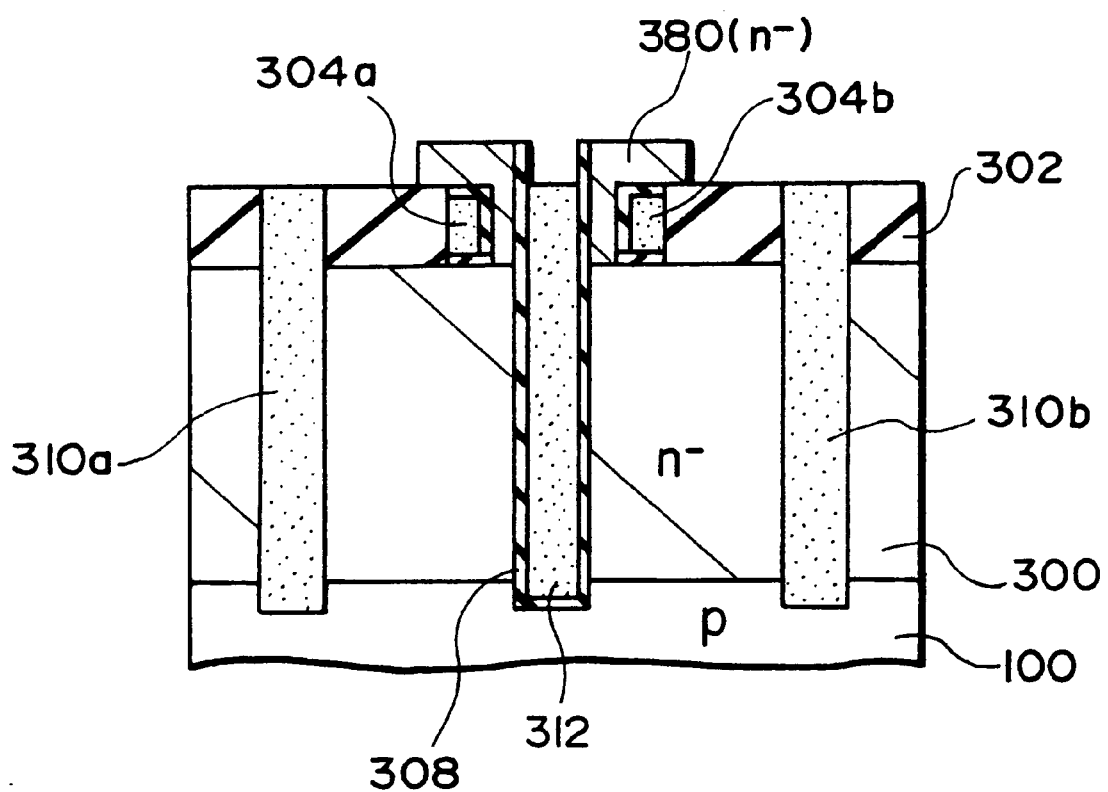
FIG. 19 is a schematic cross-section of a manufacturing method of the lateral power MOS FET in the fifth embodiment of the present invention.

Step 5:

As shown in FIG. 19, the inside of each trench is oxidized, and then the oxide films of the trenches 390a and 390b are removed, while leaving only the oxide film 308 of the trench 390b located between the trenches 390a and 390c. Thereafter, the trenches 390a, 390b and 390c are filled with the doped polysilicon layers 310a, 310b and 312.

Figure 20:
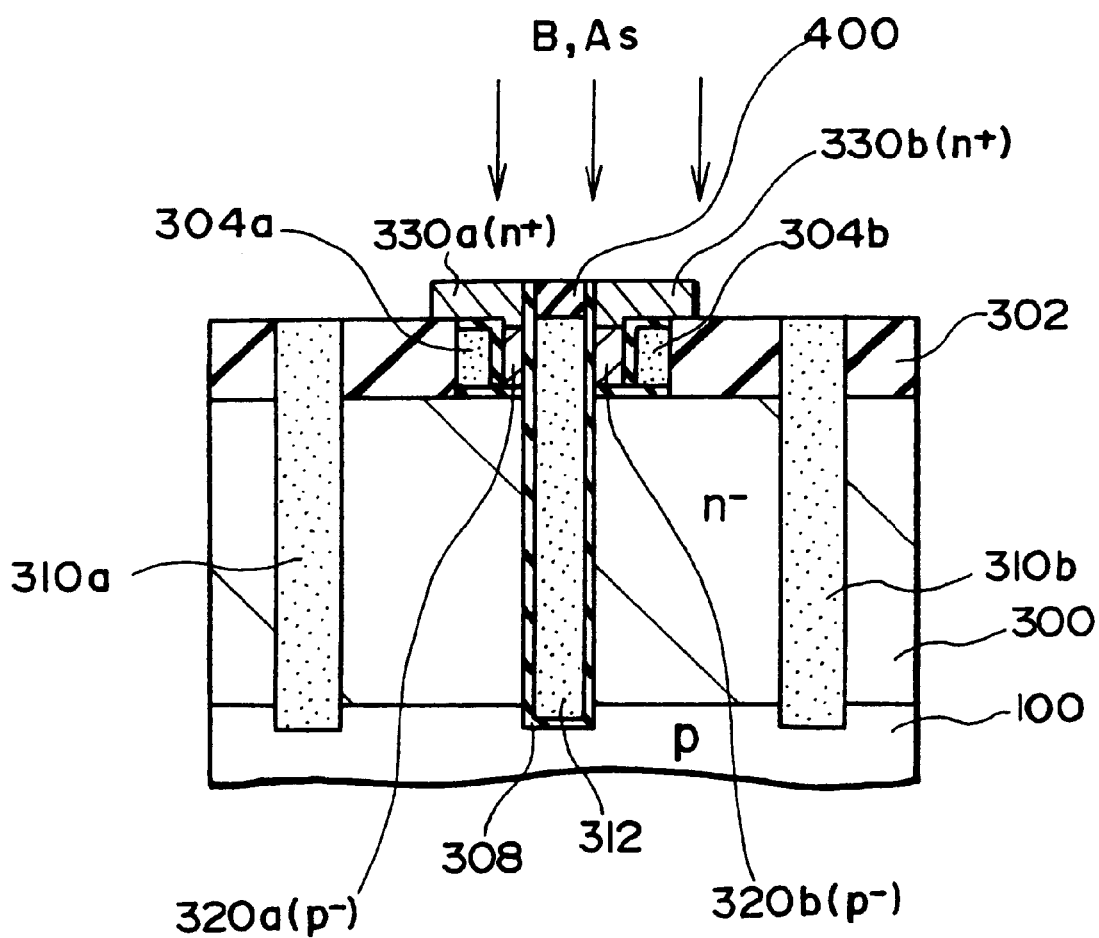
FIG. 20 is a schematic cross-section of a manufacturing method of the lateral power MOS FET in the fifth embodiment of the present invention.

Step 6:

Next, as shown in FIG. 20, the top surface of the doped polysilicon layer 312 serving as a first gate electrode is oxidized, which is buried in the central trench 390b, thus forming the cap oxide film 400. Subsequently, borons (B) are ion-implanted into the entire surface of the resultant structure, and then they are made to diffuse into the resultant structure by a thermal treatment. A thermal treatment time is controlled, so that a p-type region is formed, which extends to the bottom of the single crystal island 380 of FIG. 19 which overlaps each of the polysilicon layers 304a and 304b formed on the side walls of the island 380.

Subsequently, arsenics (As) are selectively ion-implanted into the surface of the resultant structure, followed by a thermal treatment for recovering from damages. Thus, the n$^+$-type source layers 330a and 330b are formed, and the p$^-$-type channel regions 320a and 320b are formed.

Figure 21:
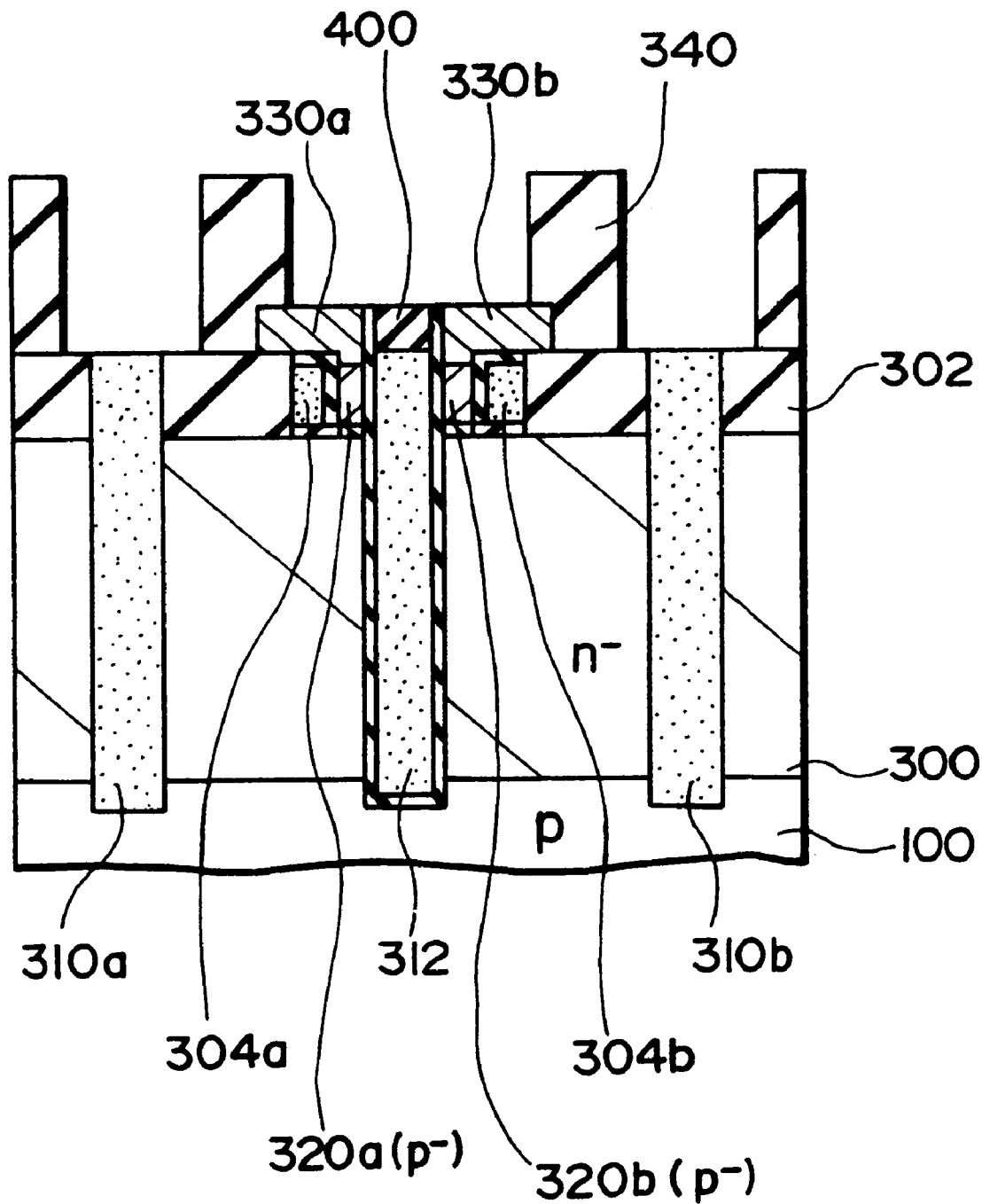
FIG. 21 is a schematic cross-section of a manufacturing method of the lateral power MOS FET in the fifth embodiment of the present invention.

Step 7:

Next, as shown in FIG. 21, the insulating film 340 such as SiO$_2$ is formed on the entire surface of the resultant structure by a CVD method, followed by selective formation of contact holes. Thereafter, the electrodes are formed, thus completing the semiconductor device 5000 of FIG. 14.

Sixth Embodiment

Figure 22:
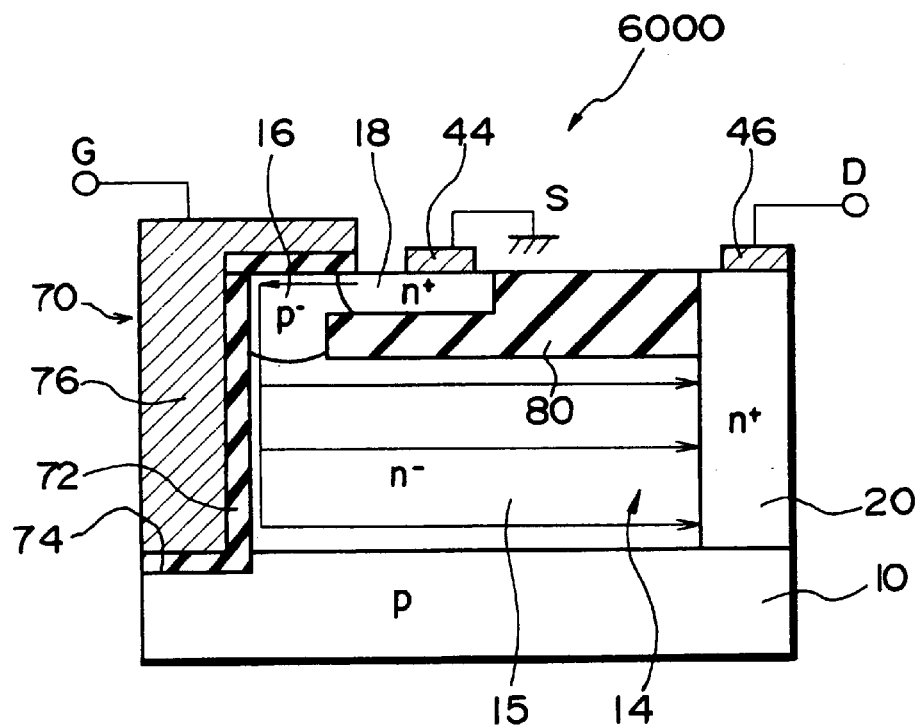
FIG. 22 is a schematic cross-section of a lateral power MOS FET in a sixth embodiment of the present invention.

FIG. 22 shows a cross-section of a semiconductor device 6000 in a sixth embodiment of the present invention. This semiconductor device 6000 adopts a single gate structure instead of the double gate structure, and comprises the insulating layer 80 between the source and the drain.

The semiconductor layer 6000 shown in FIG. 22 comprises the silicon substrate 10 containing p-type impurities; and the first semiconductor layer 14 containing n-type impurities, which is formed on the semiconductor substrate 10 and constitutes the drift region 15. In the upper principal surface of the first semiconductor layer 14, the p-type body region 16 is disposed (second semiconductor layer) which is formed by diffusing p-type impurities partially into the upper principal surface of the first semiconductor layer 14. Furthermore, n-type impurities of a high concentration are selectively diffused into a portion of the second semiconductor layer 16, whereby the source region (third semiconductor layer) 18 is formed.

In the first semiconductor layer 14, formed are the trench gate 70 and the drain region (fourth semiconductor layer) 20 containing n-type impurities of a high concentration, which are apart from each other. This drain region 20 is a trench drain which has a depth extending from the surface of the first semiconductor layer 14 to the surface of the silicon substrate 10. Moreover, the trench gate 70 is constructed such that the gate insulating film 72 is formed on the surface of the trench 74 penetrating through the body region 16 and the drift region 15 to reach the inside of the silicon substrate 10, and, for example, doped polysilicon constituting the gate electrode 76 is buried inside the gate insulating film 72. In addition, the source electrode 44 is formed on the surface of the source region 18, and the drain electrode 46 is formed on the surface of the drain region 20.

Furthermore, the insulating layer 80 is disposed between the source region 18 and the drain region 20. And one side surface of the source region 18 and the bottom surface thereof are adjacent to the insulating layer 80. The provision of the insulating layer 80 enables the breakdown voltage of the device to be higher, compared to devices without the insulating layer.

The trench gate 70 and the drain region 20 are disposed so as to stand opposite each other with the drift region 15 interposed therebetween, resulting in that most region interposed between the trench gate 70 and the drain region 20 functions as a path for allowing carriers to uniformly flow therethrough. Therefore, a cross sectional area of the current path can be larger.

Furthermore, the trench 74 of the trench gate 70 is formed so as to extend to the silicon substrate 10, and the bottom corner of the trench gate 70 is formed so as to be located within the silicon substrate 10, whereby, when a voltage is applied between the drain and the source, the high electric field at the bottom corner portion of the trench gate 70 can be suppressed, and the breakdown voltage of the device of the present embodiment can be higher compared to devices without the structure of the present embodiment.

In the semiconductor device 6000 of the present embodiment, the bottom of the gate insulating film 72 of the trench gate 70 is made to be positioned at least within the silicon substrate 10, and the insulating film 80 is disposed between the source and the drain, so that the more sufficient breakdown voltage of the device can be secured and the drift region 15 which determines the breakdown voltage of the device can be set to a minimum. Accordingly, this makes it possible to realize a reduction of the device cell size and a lateral power MOS FET which has a low on-resistance and high breakdown voltage.

Another Embodiment

Although a concrete structure is not shown, a substrate having an insulating layer which was described in the second embodiment may be adopted instead of the p-type silicon substrate used in the semiconductor device of the third to sixth embodiments. Also in these cases, similar effects to those of the device described in the second embodiment can be achieved.

Furthermore, in the third to sixth embodiments, the trench gate and the trench drain are formed by excavating the groove in the substrate. However, the device structure of the present invention is not necessarily limited to this, and a structure may be adopted, in which each electrode is made to protrude from the surface of the device, i.e., a stacked electrode. Moreover, the device of the present invention is not limited to the n-type MOS FET, and applicable also to a p-type MOS FET.

The present invention is not limited to these structures, and various modifications and applications may be possible. For example, the present invention is applicable also to power device such as an insulated gate bipolar transistor (IGBT), and an insulated gate thyristor, as well as the power MOS FET.

Figure 23:
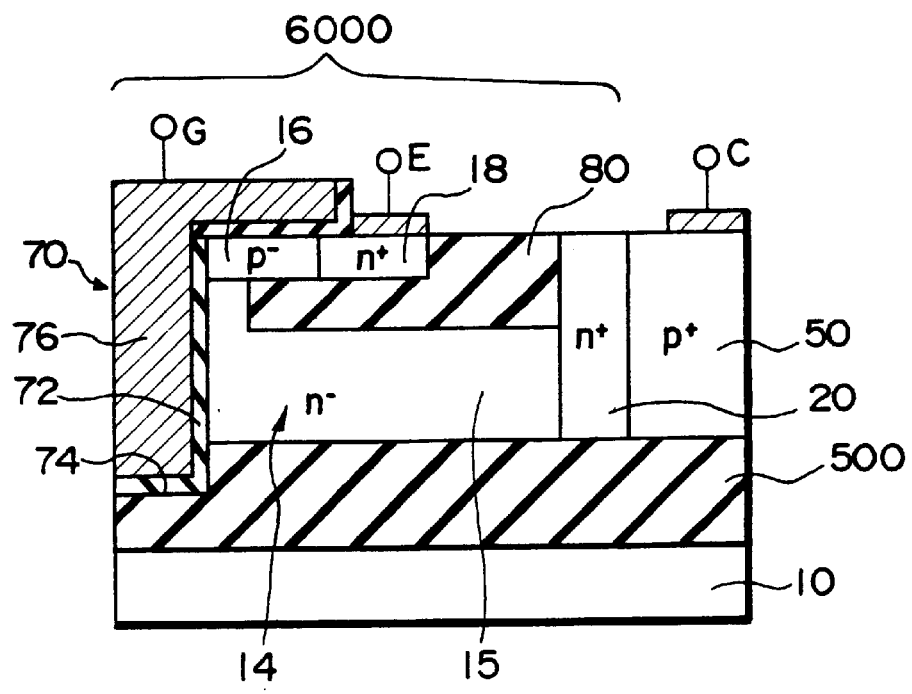
FIG. 23 is a schematic cross-section of an IGBT to which the MOS FET of the present invention is applied.

In FIG. 23, for example, the IGBT to which the present invention is applied is shown. This example includes the MOS FET 6000 in the sixth embodiment. Constituent components exhibiting functions essentially identical to those shown in FIG. 22 will be denoted using the same reference numerals, and descriptions for these components are omitted. In this example, an insulating substrate 500 is employed instead of the silicon substrate 10 of the semiconductor device 6000 of the sixth embodiment. Furthermore, a $p^+$-type impurity layer (fifth semiconductor layer) 50 constituting a collector region is formed adjacent to the drain region (buffer layer) 20.

Figure 24:
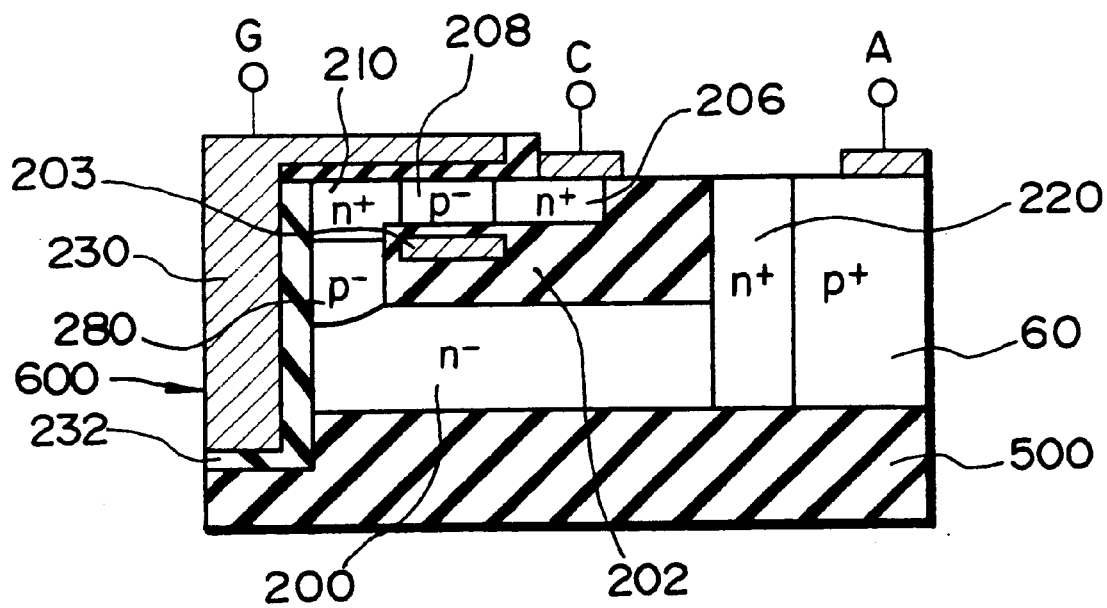
FIG. 24 is a schematic cross-section of a thyristor to which the MOS FET of the present invention is applied.
Figure 25:
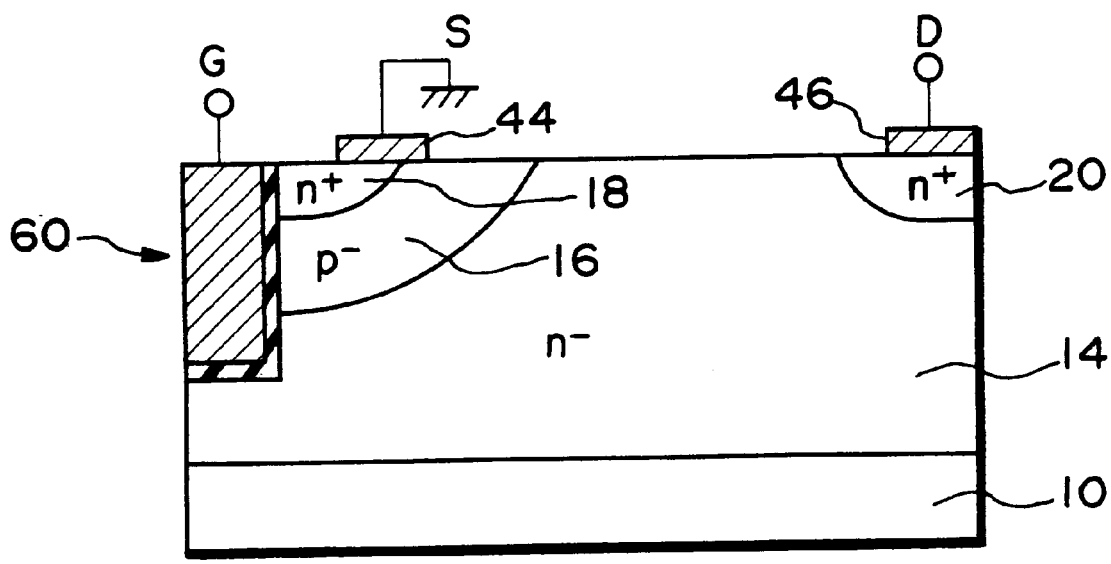
FIG. 25 is a schematic cross-section of a conventional lateral MOS FET.

In FIG. 24, for example, the MOS thyristor to which the present invention is applied is shown. This example includes an MOS FET of the same type as that of the fourth embodiment. Constituent components exhibiting functions essentially identical to those shown in FIG. 13 will be denoted using the same reference numerals, and descriptions for these components are omitted. In this example, an insulating layer 500 is employed instead of the silicon substrate 100 of the semiconductor device 4000 of the fourth embodiment. Furthermore, a $p^+$-type impurity layer (sixth semiconductor layer) 60 constituting an anode region is formed adjacent to the drain region (buffer layer) 220. Moreover, a $p^-$-type impurity layer 280 constituting a pnpn junction is disposed between the $n^+$-type impurity layer 210 and the $n^-$-type impurity layer 200.

The devices shown in FIGS. 23 and 24 are merely applied to the MOS device according to one embodiment of the present invention, and, as a matter of course, the present invention can be applied to semiconductor devices including MOS devices according to other embodiments.

Although the preferred embodiments of the present invention have been described in detail, it should be understood that various changes, substitutions and alternations can be made therein without departing from spirit and scope of the inventions as defined by the appended claims.

What is claimed is:

1. A semiconductor device including a lateral MOS element, comprising:

a semiconductor substrate of a first conductive type;

a first semiconductor layer of a second conductive type formed on said semiconductor substrate, and constituting a drift region;

a second semiconductor layer of the first conductive type in which a channel region is formed, and being provided in said first semiconductor layer;

a third semiconductor layer of the second conductive type provided in said second semiconductor layer, and constituting a source region;

a fourth semiconductor layer of the second conductive type provided in said first semiconductor layer, and constituting a drain region; and a trench gate including an insulating film formed along a surface of a trench which penetrates at least through said first semiconductor layer, and a gate electrode formed within the trench so as to fill the trench interposing the insulating film, wherein at least a bottom of said trench gate contacts with said semiconductor substrate, and wherein said fourth semiconductor layer is formed facing said trench gate.

2. The semiconductor device according to claim 1, wherein said fourth semiconductor layer is formed inside a trench formed penetrating through said first semiconductor layer.

3. A semiconductor device, comprising:

a semiconductor substrate of a first conductive type;

a first semiconductor layer of a second conductive type formed on said semiconductor substrate;

a trench gate including an insulating film formed along a surface of a trench penetrating at least through said first semiconductor layer, and a gate electrode formed within the trench;

a planar gate contacting with said trench gate;

a second semiconductor layer of said first conductive type formed below said planar gate;

a third semiconductor layer of said second conductive type formed in contact with said second semiconductor layer; and a buried gate facing said planar gate with said second semiconductor layer interposed between said planar gate with said buried gate.

4. The semiconductor device according to claim 3, wherein an impurity concentration of a region adjacent to said second semiconductor layer is made to be high, said region being a part of said first semiconductor layer located between said trench gate and said buried gate.

5. The semiconductor device according to claim 3, wherein said buried gate faces said trench gate with said second semiconductor layer interposed between said trench gate and said buried gate.

6. The semiconductor device according to claim 3, further comprising:

a fourth semiconductor layer having a plane facing said trench gate; and an insulating layer formed at a top of said first semiconductor layer, and between said third semiconductor layer and said fourth semiconductor layer.

7. The semiconductor device according to claim 3, further comprising a semiconductor layer of the first conductive type forming a collector region.

8. The semiconductor device according to claim 3, further comprising:

a semiconductor layer of the first conductive type and a semiconductor layer of the second conductive type, adjacent to said second semiconductor layer, in said first semiconductor layer; and a semiconductor layer of the first conductive type forming an anode region.

9. A semiconductor device, comprising:

an insulating layer formed on a substrate a first semiconductor layer of a second conductivity type formed on said insulating layer;

a second semiconductor layer of a first conductivity type formed in said first semiconductor layer, and forming a channel region;

a third semiconductor layer of a second conductivity type formed in said second semiconductor layer, and forming a source region;

a fourth semiconductor layer of a second conductivity type formed in said first semiconductor layer, and forming a drain region;

a trench gate including an insulating film formed along a surface of a trench which penetrates at least through said first semiconductor layer, and a gate electrode formed within the trench so as to fill the trench, wherein at least a bottom of said trench gate contacts with said insulating layer formed on said substrate.

10. The semiconductor device according to claim 9, wherein said fourth semiconductor layer is formed inside a trench formed penetrating through said first semiconductor layer.

11. A semiconductor device, comprising:

an insulating layer formed on a semiconductor substrate;

a first semiconductor layer of a second conductive type formed on said insulating layer;

a trench gate including an insulating film formed along a surface of a trench penetrating at least through said first semiconductor layer, and a gate electrode formed within the trench;

a planar gate contacting with said trench gate;

a second semiconductor layer of a first conductive type formed below said planar gate;

a third semiconductor layer of said second conductive type formed in contact with said second semiconductor layer; and a buried gate facing said planar gate with said second semiconductor layer interposed between said planar gate with said buried gate.

12. The semiconductor device according to claim 11, wherein an impurity concentration of a region adjacent to said second semiconductor layer is made to be high, said region being a part of said first semiconductor layer located between said trench gate and said buried gate.

13. The semiconductor device according to claim 11, wherein said buried gate faces said trench gate with said second semiconductor layer interposed between said trench gate and said buried gate.

14. The semiconductor device according to claim 11, further comprising:

a fourth semiconductor layer having a plane facing said trench gate; and an insulating layer formed at a top of said first semiconductor layer, and between said third semiconductor layer and said fourth semiconductor layer.

15. The semiconductor device according to claim 11, further comprising a semiconductor layer of the first conductive type forming a collector region.

16. The semiconductor device according to claim 11, further comprising:

a semiconductor layer of the first conductive type and a semiconductor layer of the second conductive type, adjacent to said second semiconductor layer, in said first semiconductor layer; and a semiconductor layer of the first conductive type forming an anode region.

* * * * *